(12) United States Patent
Lei et al.

(10) Patent No.: US 11,270,503 B2
(45) Date of Patent: Mar. 8, 2022

(54) METHOD, DEVICE AND COMPUTER READABLE STORAGE MEDIUM FOR GENERATING VOLUME FOLIATION

(71) Applicant: DALIAN UNIVERSITY OF TECHNOLOGY, Liaoning (CN)

(72) Inventors: Na Lei, Liaoning (CN); Xiaopeng Zheng, Liaoning (CN); Zhongxuan Luo, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 0 days.

(21) Appl. No.: 17/283,206

(22) PCT Filed: Jul. 24, 2020

(86) PCT No.: PCT/CN2020/104532
§ 371 (c)(1),
(2) Date: Apr. 6, 2021

(87) PCT Pub. No.: WO2021/031795
PCT Pub. Date: Feb. 25, 2021

(65) Prior Publication Data
US 2021/0358208 A1   Nov. 18, 2021

(30) Foreign Application Priority Data

Aug. 20, 2019  (CN) .......................... 201910772157.9
Mar. 11, 2020  (CN) .......................... 202010166958.3

(51) Int. Cl.
*G06T 17/10* (2006.01)
*G06T 17/20* (2006.01)
(Continued)

(52) U.S. Cl.
CPC .............. *G06T 17/10* (2013.01); *G06F 30/20* (2020.01); *G06T 17/20* (2013.01); *G06T 17/205* (2013.01); *G06T 17/30* (2013.01); *G06T 2210/16* (2013.01)

(58) Field of Classification Search
CPC ....... G06T 17/10; G06T 17/20; G06T 17/205; G06T 17/30; G06T 2210/16; G06F 30/20
See application file for complete search history.

(56) References Cited

U.S. PATENT DOCUMENTS

2010/0328311 A1  12/2010  Lakshmanan et al.
2018/0012407 A1*  1/2018  Chuang ..................... G06T 7/75

FOREIGN PATENT DOCUMENTS

CN    101251932 A    8/2008
CN    101639946 A    2/2010
(Continued)

OTHER PUBLICATIONS

Lei, Na, et al. "Quadrilateral and hexahedral mesh generation based on surface foliation theory." Computer Methods in Applied Mechanics and Engineering 316 (2017): 758-781. (Year: 2017).*
(Continued)

*Primary Examiner* — Daniel F Hajnik
(74) *Attorney, Agent, or Firm* — Muncy, Geissler, Olds & Lowe, P.C.

(57) ABSTRACT

The present invention discloses a method, device and computer readable storage medium (CRSM) for generating a volume foliation. The method comprises: constructing a pants decomposition graph on a smooth closed surface S of genus g>1, wherein the surface S has g handles, and the pants are a genus-zero triangular mesh surface with g boundaries; constructing an initial mapping $f_0:(T,g) \to (G_r, h)$ from a tetrahedral mesh T to a graph $G_r$, by a process of extending a topological disk $D_k$ into a solid cylinder $C_k$; evolving the initial mapping into a generalized harmonic
(Continued)

map by the $n^{th}$ iterative mapping; and obtaining a volume foliation of the tetrahedral mesh T from preimages of all nodes of a metric graph ($G_r$, h) and points on edges of the metric graph ($G_r$, h) under the generalized harmonic map f.

8 Claims, 3 Drawing Sheets

(51) Int. Cl.
  *G06F 30/20* (2020.01)
  *G06T 17/30* (2006.01)

(56) References Cited

FOREIGN PATENT DOCUMENTS

| CN | 105608743 A | 5/2016 |
|----|-------------|--------|
| CN | 111369682 A | 7/2020 |

OTHER PUBLICATIONS

Lei, Na, et al. "Quadrilateral and hexahedral mesh generation based on surface foliation theory II." Computer Methods in Applied Mechanics and Engineering 321 (2017): 406-426. (Year: 2017).*

Zheng, Xiaopeng, et al. "Surface registration via foliation." Proceedings of the IEEE International Conference on Computer Vision. 2017. (Year: 2017).*

Si, Hang. "TetGen, a Delaunay-based quality tetrahedral mesh generator." ACM Transactions on Mathematical Software (TOMS) 41.2 (2015): 1-36. (Year: 2015).*

Wen, Chengfeng, et al. "Brain Morphometry Analysis with Surface Foliation Theory." arXiv preprint arXiv: 1809.02870 (2018). (Year: 2018).*

Zheng Xiaopeng, "The research of foliations on surfaces and Birkhoff interpolation," Jilin University, Oct. 15, 2017, ISSN: 1674-022X, 93 pages.

* cited by examiner

METHOD, DEVICE AND COMPUTER READABLE STORAGE MEDIUM FOR GENERATING VOLUME FOLIATION

TECHNICAL FIELD

The present invention generally relates to the geometry field of computational geometry and computational commonality. More specifically, the present invention relates to a method, device and computer readable storage medium (CRSM) for generating a volume foliation.

BACKGROUND

With the development of computer graphics, three-dimensional scanning technology, and industrial modeling and simulation technology, relevant demand for three-dimensional model processing is increasing. Parameterization is one of the core foundations of three-dimensional model processing technology. At present, the research on the parameterization of a curved surface of a three-dimensional model is relatively sufficient, but the research on the volume parameterization inside a three-dimensional model is still not perfect. The parametric application of volume mesh is very extensive, especially in volume mesh generation, information reuse, shape matching and analysis, and mesh reconstruction, and is also of great significance to the post-processing of a model.

Mesh parameterization has already become an indispensable tool in the field of computer graphics, which can be used not only for surface information processing of digital geometry, but also for surface processing of engineering. Different mesh parameterization methods are selected according to different types of applications and different application conditions. For example, surface fitting usually requires the distortion of mesh parameterization to be as small as possible, while texture mapping of a model requires the parameterization to have an area-preserving property, etc.

Relatively mature researches on mesh parameterization of curved surfaces have been carried out in the past decade. Tutte has first proposed a graph method which adopts the idea of linear mapping and is directly applied to triangular meshes. On this basis, Eck and Floater have proposed a new method which solves linear parameter equations to realize mesh parameterization. In addition, Eck has introduced a discrete harmonic map, and approximately obtain a continuous harmonic map by minimizing the metric discrete standard. Desbrun et al. have calculated discrete Dirichlet energy to achieve conformal parameterization, while Pinkall and Polthier et al. calculate a discrete harmonic map and a Hodge star operator to create a minimum parameterized surface. The main ideas of these algorithms can be summarized as that: a system of quadratic equations is used to express the local distortion energy that appears in the process of mesh parameterization, and then linear equations are solved through continuous iteration to optimize the distortion energy generated in the whole process, so as to achieve optimal parameterization. However, these methods have a common ground, that is, parameters of parameterized boundaries need to be set in advance, and then parameters of internal vertices are solved through a set of linear equations.

With the continuous emergence of new applications, many people have proposed new mesh parameterization methods. Such methods can perform mesh parameterization on a free boundary, and a core idea thereof is to obtain an optimal parameterized mesh by adjusting and optimizing parameters of a mesh distortion energy function. For example, Hormann et al. have proposed a parameterization method based on MIPS energy function, Levy has proposed a parameterization method based on a Conformal energy function, Desbrun has proposed a parameterization method based on a Stretch energy function, and so on. Although these methods have achieved parameterization with a relatively good effect, the calculation methods thereof are much more complicated than linear methods, and the parameterization process is not rigid, i.e., there is flipping, and the robustness cannot be guaranteed.

In addition, the current volume harmonic map algorithm and line foliation algorithm of a curved surface can only process the parameterization of the internal area of a topological sphere, but cannot process the volume parameterization of the internal area of a high-genus curved surface.

SUMMARY

In view of the above-mentioned problems in the prior art, the present invention proposes a corresponding solution. The solution is based on a generalized harmonic map, which can generate a volume foliation, and finally realize global volume parameterization.

In order to at least solve the above technical problems, in one aspect, the present invention proposes a method for generating a volume foliation, wherein the method executes the following steps through one or more processors of a computer: first, constructing a pants decomposition graph on closed surface S of genus g>1, wherein the surface S has g handles, and the pants are a genus-zero triangular mesh surface with g boundaries; then, constructing an initial mapping $$f_0 : (T, g) \to (G_r, h)$$

from a tetrahedral mesh T to a graph $G_r$ in a process of extending a topological disk $D_k$ into a solid cylinder $C_k$, wherein a cylinder $C_k \in T$ is mapped to an edge $e_k \in G$, and the upper and lower surfaces of a cylindrical surface are correspondingly mapped to nodes in the metric graph $(G_r, h)$; next, evolving the initial mapping into a generalized harmonic map by n iterative mappings, wherein n=1, 2, ... k+1; and finally, obtaining a volume foliation of the tetrahedral mesh T from preimages of all nodes of the metric graph $(G_r, h)$ and points on edges of the metric graph $(G_r, h)$ under the generalized harmonic map f.

In one embodiment, the process of constructing a pants decomposition graph comprises: constructing a plurality pairs of pants $P_j$, and letting each pair of pants $P_j$ be corresponding to a node $\Gamma_j$ in the graph $G_r$, and each loop $\gamma_k$ be corresponding to an edge $e_k$ in the graph; assign the length of the edge with height parameter $h_k$, the loop $\gamma_k$ is connected with two pairs of pants $P_i$ and $P_j$, and nodes $\Gamma_i$ and $\Gamma_j$ are connected by the corresponding edge $e_k$ in the graph, wherein i,j=1, 2, ..., 2g−2; and k=1, 2, ..., 3g−3, thus to obtain the pants decomposition metric graph $(G_r, h)$ of the triangular mesh surface M.

In another embodiment, the process of constructing a plurality pairs of pants $P_j$ comprises: first, approximately representing the surface S by the triangular mesh surface M, and designating a loop on each handle of the triangular mesh surface M, thus to obtain a group of loops $\gamma_1, \gamma_2, \ldots \gamma_g$; then, cutting the triangular mesh surface M along the loops $\gamma_1, \gamma_2, \ldots \gamma_g$ respectively, thus to obtain a genus-zero triangular mesh surface $M_i$ with 2g boundaries; and finally, selecting a loop $\gamma_{g+i}$ on the surface $M_i$, so that after cutting the triangular mesh surface $M_i$ along this loop, a genus-zero triangular mesh surface $M_{i+1}$ with 2g-1 boundaries and a genus-zero triangular mesh surface with 3 boundaries (i.e., pants $P_j$) are obtained, wherein i,j=1, 2, . . . , 2g-2.

In still another embodiment, the process of extending a topological disk $D_k$ into a cylinder $C_k$ comprises: assuming that a directional triangular face set in the tetrahedral mesh T is $\{\Delta_1, \Delta_2, \ldots, \Delta_m\}$, and for the loop $\gamma_k$ (k=1, 2, . . . , 3g-3), solving a constraint optimization problem on $\lambda_l$ (l=1, 2, . . . , m)

$$\min \sum_{l=1}^{m} \lambda_l^2$$

$$\text{s.t.} \begin{cases} \lambda_l \in \{-1, 0, +1\} \\ \sum_{l=1}^{m} \lambda_l \partial \Delta_l = \gamma_k \end{cases}$$

Thus to obtain a set of solutions $\lambda^*_l$ (l=1, 2, . . . , m); letting $D_k = \sum_{l=1}^{m} \lambda^*_l \Delta_l$, then $D_k$ is a topological disk with $\gamma_k$ as a boundary in the tetrahedral mesh T, i.e., $\partial D_k = \gamma_k$; and extending the topological disk $D_k$ into a cylinder $C_k$, so that $T = U_{k=1}^{3g-3} C_k$, then the cylinder $C_k$ is corresponding to the edge $e_k$ in the pants decomposition metric graph $(G_r, h)$.

In yet another embodiment, the n iterative mappings comprise: taking a vertex $v_i$ in the tetrahedral mesh T, recording an adjacent point set thereof as $\{v_j^i\}_{j=1}^{n_i}$, assuming that an edge $[v_i, v_j^i]$ connecting vertices $v_i$ and $v_j^i$ is a common edge of m tetrahedrons $T_l$ (l=1, 2, . . . , m) in the mesh T, and letting $$w_{ij} = \frac{1}{12} \sum_{l=1}^{m} a_l \cot \theta_l,$$

wherein $\theta_l$ is a dihedral angle corresponding to the edge $[v_i, v_j^i]$ in a tetrahedron $T_l$, $a_l$ is the length of an edge opposite to the edge $[v_i, v_j^i]$ in the tetrahedron $T_l$, the $k^{th}$ iterative mapping is denoted as $$f_k : (T, g) \to (G_r, h),$$

and a weighted geodesic barycenter of $\{f_k(v_j^i) | v_j^i \in v_i\}$ is defined as follows: $c_k(v_i) := \operatorname{argmin}_{p \in G_r} \sum_{j=1}^{n_i} w_{ij} d(p, f_k(v_j^i))^2$, wherein $d(p, f_k(v_j^i))$ represents the length of the shortest path between two points P and $f_k(v_j^i)$ in the graph $G_r$; and using the weighted geodesic barycenter $c_k(v_i)$ to update the image of $v_i$ in the mapping $f_k$, thereby obtaining the $(k+1)^{th}$ iterative mapping:

$$f_{k+1}(v_i) \leftarrow c_k(v_i).$$

In finally another embodiment, the process of evolving the initial mapping into a generalized harmonic map comprises: denoting the set of all edges in the tetrahedral mesh T as $\Lambda = \{[v_i, v_j]\}$, and defining the harmonic energy of the mapping $$f_k : (T, g) \to (G_r, h)$$

as: $E(f_k) := \frac{1}{2} \sum_{[v_i, v_j] \in \Lambda} w_{ij} d(f_k(v_i), f_k(v_j))^2$; when the harmonic energy difference $E(f)_k - E(f_{k+1})$ of two adjacent iterative mappings is less than a given threshold, iteration is terminated and a generalized harmonic map $f := f_{k+1}$ is obtained.

In another aspect, the present invention proposes a device for generating a volume foliation, comprising: a processor, which is configured to execute a program instruction; and a memory, which is configured to store the program instruction; and when the program instruction is loaded and executed by the processor, the device is caused to execute the method described in the above-mentioned aspect and multiple embodiments thereof.

In still another aspect, the present invention provides a computer readable storage medium (CRSM) in which a program instruction for generating a volume foliation is stored; and when the program instruction is executed by the processor, a computer is caused to execute the method described in the above-mentioned aspect and multiple embodiments thereof.

Through the method, device and computer readable storage medium (CRSM) for generating volume foliation based on the generalized harmonic map disclosed above in the present invention, an entity with a high-genus boundary curved surface can be processed. For example, for a given entity with a high-genus boundary curved surface, a relevant algorithm is used to calculate a pants decomposition of the curved surface, thus to construct a pants decomposition graph; then, a harmonic map from the curved surface to the graph is solved, thus to obtain a curved surface foliation; and further, the curved surface foliation is taken as a boundary condition to calculate a harmonic map from the entity to the same graph, thus to obtain a volume foliation composed of a plurality of topological disks. On this basis, a low-dimension decomposition from the entity to the topological disks is induced by the volume foliation, and global volume parameterization can finally be realized by mapping each topological disk to a unit circle. The method of the present invention is easy to realize, the algorithm efficiency is high, and the problem of distortion caused by parameterization is solved more conveniently. In addition, the solution of the present invention is rigid and conformal.

DESCRIPTION OF DRAWINGS

The above-mentioned features of the present invention can be better understood in combination with the drawings, and numerous purposes, features and advantages of the present invention are apparent to those skilled in the art. The drawings in the following description are merely some embodiments of the present invention, and for those ordinary skilled in the art, other drawings can also be obtained according to the drawings without contributing creative labor, wherein.

DETAILED DESCRIPTION

Multiple aspects and various embodiments of the present invention provide a method, device and computer readable storage medium (CRSM) for generating a volume foliation by various computing devices (for example, various computers). The solution of the present invention realizes the global volume parameterization of an entity with a high-genus boundary curved surface. It should be understood that the present application illustrates many specific details in order to provide a thorough understanding of the embodiments of the present invention. However, those ordinary skilled in the art will understand that the embodiments described in the present invention may be practiced without these specific details. In other cases, well-known methods, processes and components are not described in detail so as not to obscure the embodiments described herein. Moreover, the description should not be regarded as a limitation to the scope of the embodiments described herein.

The technical solution in the embodiments of the present invention will be clearly and fully described below in combination with the drawings. Apparently, the described embodiments are merely part of the embodiments of the present invention, not all of the embodiments. Based on the embodiments in the present invention, all other embodiments obtained by those ordinary skilled in the art without contributing creative labor will belong to the protection scope of the present invention.

Figure 1:
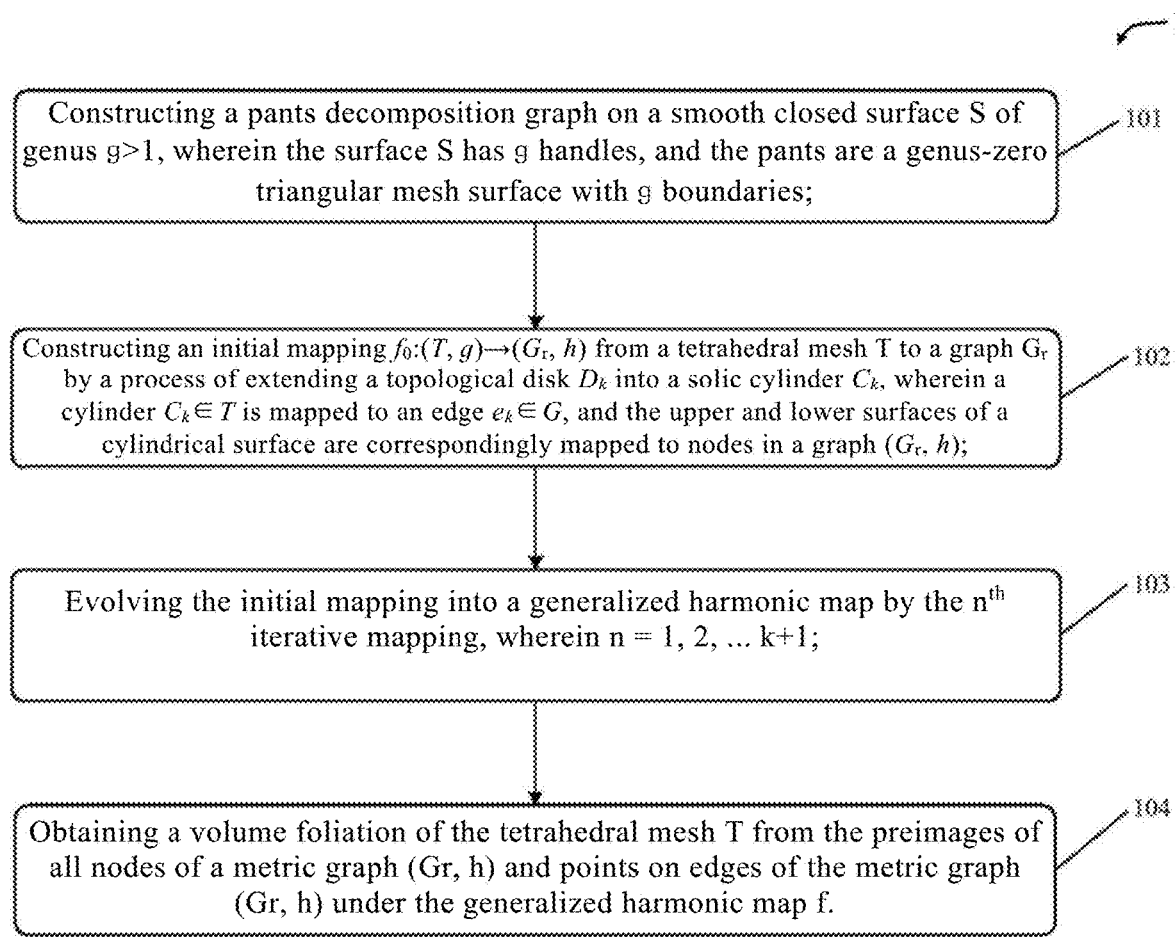
FIG. 1 is a flow block diagram schematically showing the method for generating volume foliation according to an embodiment of the present invention.

FIG. 1 is a flow block diagram showing a method 100 for generating a volume foliation by a computer according to an embodiment of the present invention.

As shown in FIG. 1, the method 100 proposed by the present invention first executes a step 101. In this step, a pants decomposition graph is constructed on smooth closed surface S of genus g>1, wherein the surface S has g handles, and the pants are a genus-zero triangular mesh surface with g boundaries. In order to better explain the constructed pants decomposition graph, a model need to be established, defined and explained accordingly. It is assumed that a smooth closed surface S of genus 3 is input, and the surface S has 3 handles. An entity in the Euclidean space inside the surface is expressed as V; in actual operation, the entity V is approximately expressed by a tetrahedral mesh T; and the surface S is approximately expressed by a triangular mesh surface M. A curved surface foliation is a structure that divide the surface into mutually disjoint one-dimensional leaves. For a given high-genus curved surface, a special type of foliation with all ordinary leaves thereof being close loops can be found, and such foliation is called finite measurable foliation. The finite measurable foliation of the curved surface is decomposed into a group of close loops. If each loop is reduced to a point, then the entire curved surface will be reduced into a graph, and each edge in the graph is corresponding to a topological cylinder on the curved surface. In order to facilitate those skilled in the art to understand the pants decomposition operation here, the decomposition operation will be described in detail and schematically in combination with FIG. 2 and FIG. 3 first.

Figure 2:
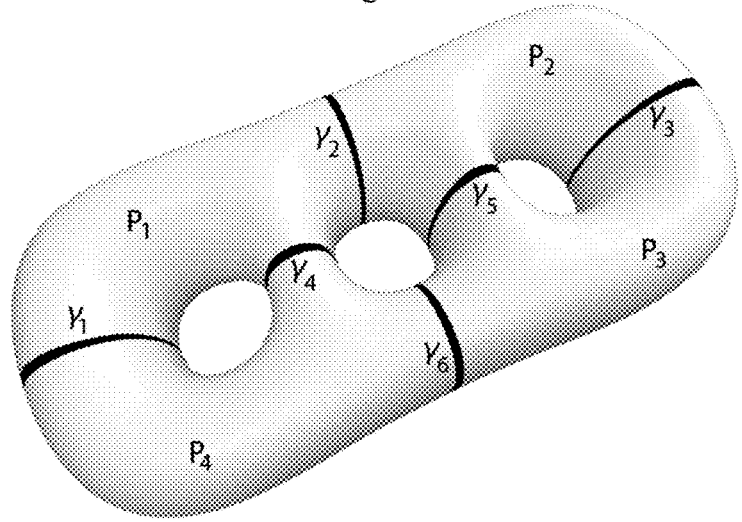
FIG. 2 is a diagram schematically showing input loops on a surface S of genus 3 according to an embodiment of the present invention.

FIG. 2 is a schematic diagram schematically showing input loops on a surface S of genus 3 according to an embodiment of the present invention. In one embodiment, pants decomposition will be performed on the triangular mesh surface M. First, a loop is designated on each handle of the triangular mesh surface M, thus to obtain a group of loops $\gamma_1$, $\gamma_2$ and $\gamma_3$. Then, the triangular mesh surface M is cut along the loops $\gamma_1$, $\gamma_2$ and $\gamma_3$ respectively, thus to obtain a genus-zero triangular mesh surface $M_0$ with 6 boundaries. Next, a loop $\gamma_4$ is selected on the triangular mesh surface $M_0$, so that after the triangular mesh surface $M_0$ is cut along this loop, a genus-zero triangular mesh surface $M_1$ with 5 boundaries and a genus-zero triangular mesh surface $P_1$ with 3 boundaries (also call pants) can be obtained; a loop $\gamma_5$ is selected on the triangular mesh surface $M_1$, so that after the triangular mesh surface $M_1$ is cut along this loop, a genus-zero triangular mesh surface $M_2$ with 4 boundaries and a pair of pants $P_2$ can be obtained; and finally, a loop $\gamma_6$ is selected on a triangular mesh surface $M_3$ with 4 boundaries, so that after the triangular mesh surface $M_3$ is cut along this loop, two pair of pants $P_3$ and $P_4$ can be obtained.

Figure 3:
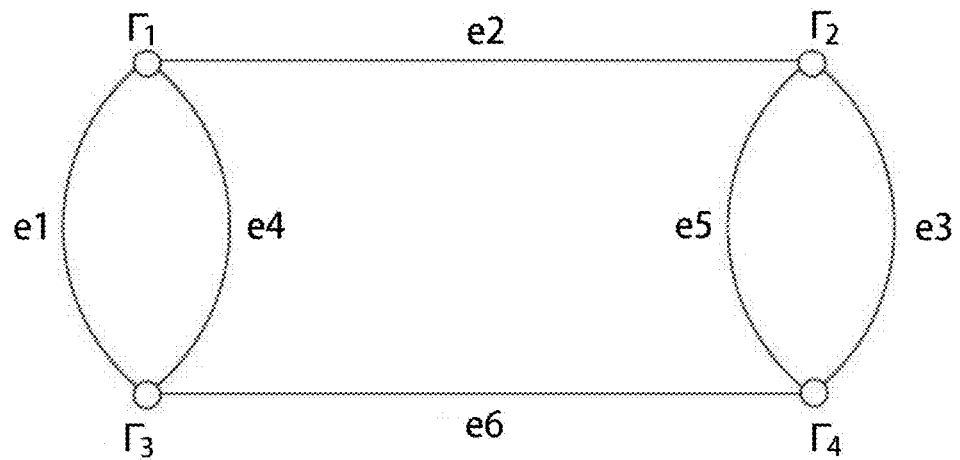
FIG. 3 schematically shows a pants decomposition metric graph on a surface S of genus 3 according to an embodiment of the present invention.

FIG. 3 is a schematic diagram of pants decomposition metric showing a surface S of genus 3 according to an embodiment of the present invention. As shown in FIG. 3, letting each pair of pants $P_j$ on the triangular mesh surface M be corresponding to a node $\Gamma_j$ in the graph and each loop $\gamma_k$ be corresponding to an edge $e_k$ in the graph, then the length of the edge is a corresponding height parameter $h_k$; if the loop $\gamma_k$ on the triangular mesh surface M is connected with two pairs of pants $P_i$ and $P_j$, and nodes $\Gamma_i$ and $\Gamma_j$ are connected by the corresponding edge $e_k$ in the graph, wherein i,j=1, 2, . . . , 2g-2; and k=1, 2, . . . , 3g-3, thus to obtain the pants decomposition metric graph ($G_r$, h) of the triangular mesh surface M.

Returning to the flow chart of FIG. 1, after the pants decomposition graph is constructed, the method 100 proceeds to a step 102. In this step, an initial mapping $$f_0 : (T, g) \to (G_r, h)$$

from a tetrahedral mesh T to a graph $G_r$ is constructed by a process of extending a topological disk $D_k$ into a cylinder $C_k$, wherein a cylinder $C_k \in T$ is mapped to an edge $e_k \in G$, and the upper and lower surfaces of a cylindrical surface are correspondingly mapped to nodes in a graph ($G_r$, h).

In one embodiment, the process of extending a topological disk $D_k$ into a cylinder $C_k$ is as follows: assuming that a directional triangular face set in the tetrahedral mesh T is $\{\Delta_1, \Delta_2, \ldots, \Delta_m\}$, and for the loop $\gamma_k$ (k=1, 2, . . . , 6), solving a constraint optimization problem on $\lambda_l$ (l=1, 2, . . . , m):

$$\min \sum_{l=1}^{m} \lambda_l^2$$

$$\text{s.t.} \begin{cases} \lambda_l \in \{-1, 0, +1\} \\ \sum_{l=1}^{m} \lambda_l \partial \Delta_l = \gamma_k \end{cases}$$

Thus to obtain a set of solutions $\lambda^*_l$ (l=1, 2, . . . , m); letting $D_k = \sum_{l=1}^{m} \lambda^*_l \Delta_l$, then $D_k$ is a topological disk just with $\gamma_k$ as a boundary in the tetrahedral mesh T, i.e., $\partial D_k = \gamma_k$. Extending the topological disk $D_k$ into a cylinder $C_k$, so that $T=U_{k=1}^{3g-3}C_k$, then the cylinder $C_k$ is corresponding to the edge $e_k$ in the pants decomposition metric graph $(G_r, h)$.

Figure 4:
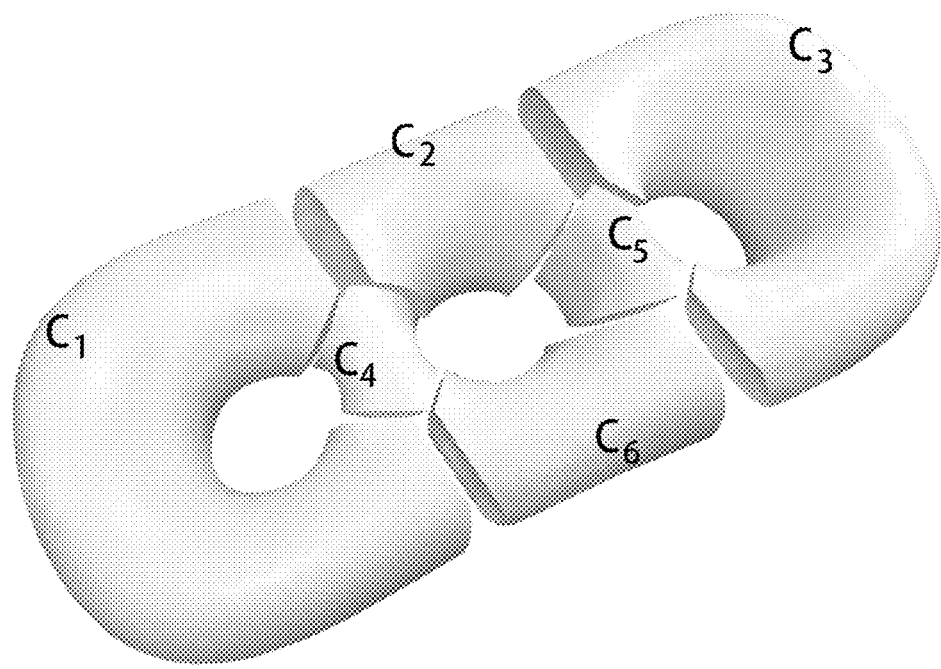
FIG. 4 schematically shows a cylinder decomposition graph of an entity V of genus 3 according to an embodiment of the present invention.

In order for those skilled in the art to better understand the operation of the step 102, further explanation will be given below in combination with FIG. 4. FIG. 4 is a schematic diagram showing the cylinder decomposition of an entity V with a genus of 3 according to an embodiment of the present invention.

As shown in FIG. 4, in one embodiment, the topological disk $D_k$ is extended into a cylinder $C_k$ first, so that $T=U_{k=1}^{6}C_k$, then the cylinder $C_k$ is corresponding to the edge $e_k$ in the pants decomposition metric graph $(G_r, h)$. Then, an initial mapping $$f_0 : (T, g) \to (G_r, h)$$

is constructed in a process of extending a topological disk $D_k$ into a cylinder $C_k$, a cylinder $C_k \in T$ is mapped to an edge $e_k$ E G, and the upper and lower surfaces of a cylindrical surface are correspondingly mapped to nodes in a graph $(G_r, h)$.

Returning to FIG. 1, the method 100 now executes a step 103. In this step, the method 100 executes the process of evolving the initial mapping into a generalized harmonic map by n iterative mappings, wherein n=1, 2, . . . k+1. In order to better understand the step 103, a harmonic map and a generalized harmonic map are briefly described below.

It can be imagined as that the source surface is made of a rubber film, and the target curved surface is made of extremely smooth marble after surface polishing (without friction). Then the marble is wrapped with the rubber film, and the rubber film slides freely and frictionlessly on the smooth marble surface. When the system reaches a stable equilibrium state, elastic deformation potential energy of the rubber film is the minimum, and the map obtained at this time is a harmonic map. The harmonic map can minimize the elastic deformation potential energy. The theory of partial differential equations proves the existence, uniqueness, stability, correctness and smoothness of the harmonic map; and differential geometry guarantees the differential homeomorphism and conformal invariance of the harmonic map. Therefore, the harmonic map has a complete theory, is simple and intuitive, and is widely used in engineering practice.

Whereas a generalized harmonic map gives a real-valued function defined on a volume, and harmonic energy thereof is defined as integral calculus of $L^2$ norm of a gradient thereof. The generalized harmonic map minimizes the harmonic energy. A metric graph $(G, h)$ is a graph in which each edge e, is assigned a positive weight $h_i$. Assuming that each edge is regarded as an interval $[0, h_i]$ on a real axis, for a given map $$f : V \to G$$

from a volume to a graph, a preimage of nodes in the graph is defined as $\Gamma$, wherein $\Gamma$ can be "measure zero". V is divided into several independent disjoint continuous parts by $\Gamma$: $V \setminus \Gamma = U_i C_i$, wherein each part $C_i$ is mapped to an edge $e_i$ of the graph, and the restriction of f on C, can be regarded as a function $$f : C_i \to [0, h_i].$$

Therefore harmonic energy thereof can be defined as follows: the harmonic energy of the entire map is the sum of the harmonic energy of the functions on each connected component. A harmonic map from a volume to a graph minimizes the harmonic energy.

In one embodiment, first, a vertex $v_i$ in the tetrahedral mesh T is taken, an adjacent point set thereof is recorded as $\{v_j^i\}_{j=1}^{n_i}$, it is assumed that an edge $[v_i, v_j^i]$ connecting vertices $v_i$ and $v_j^i$ is a common edge of m tetrahedrons $T_l$ (l=1, 2, . . . , m) in the mesh T, and it is let that $$w_{ij} = \frac{1}{12}\sum_{l=1}^{m} a_l \cot\theta_l,$$

wherein $\theta_l$ is a dihedral angle corresponding to the edge $[v_i, v_j^i]$ in a tetrahedron $T_l$, and $a_l$ is the length of an edge opposite to the edge $[v_i, v_j^i]$ in the tetrahedron $T_l$. The $k^{th}$ iterative mapping is denoted as $$f_k : (T, g) \to (G_r, h),$$

and a weighted geodesic barycenter of $\{f_k(v_j^i)|v_j^i \in v_i\}$ is defined as follows: $c_k(v_i) = \operatorname{argmin}_{p \in G_r} \sum_{j=1}^{n_i} w_{ij} d(p, f_k(v_j^i))^2$, wherein $d(p, f_k(v_j^i))$ represents the length of the shortest path between two points p and $f_k(v_j^i)$ in the graph $G_r$. The weighted geodesic barycenter $c_k(v_i)$ is used to update the image of $v_i$ in the mapping $f_k$, thereby obtaining the $(k+1)^{th}$ iterative mapping:

$$f_{k+1}(v_i) \leftarrow c_k(v_i).$$

Next, the set of all edges in the tetrahedral mesh T is denoted as $\Lambda = \{[v_i, v_j]\}$, the harmonic energy of the mapping $$f_k : (T, g) \to (G_r, h)$$

is defined as $E(f_k) := \frac{1}{2}\sum_{[v_i,v_j]\in\Lambda} w_{ij} d(f_k(v_i), f_k(v_j))^2$, and the above steps are repeated; when the harmonic energy difference $E(f_k) - E(f_{k+1})$ of two adjacent iterative mappings is less than a given threshold, iteration is terminated and a generalized harmonic map $f := f_{k+1}$ is obtained.

Figure 5:
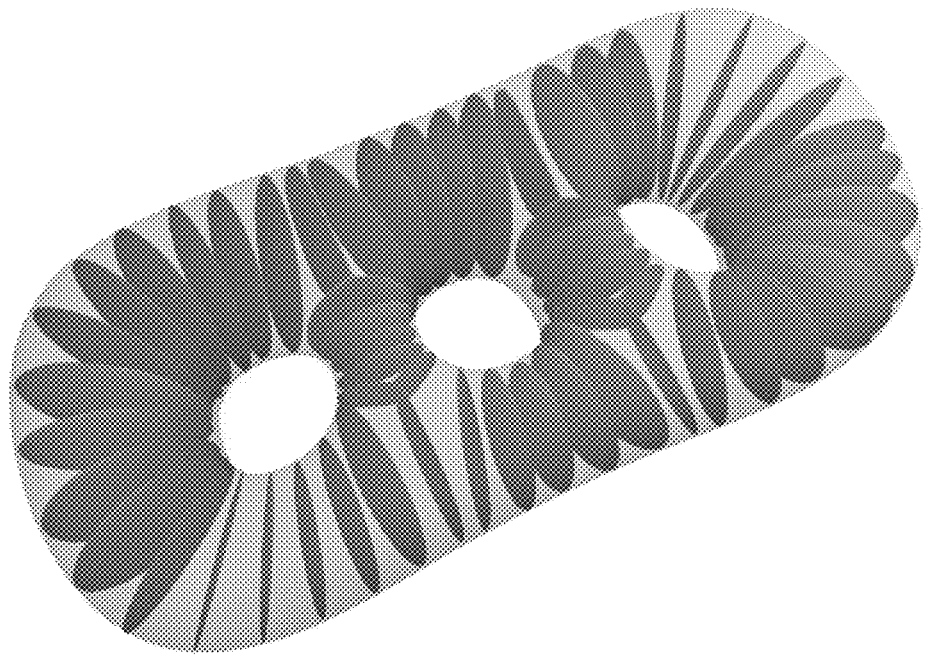
FIG. 5 schematically shows a volume foliation of an entity V with a genus of 3 according to an embodiment of the present invention.

Returning to the flow chart of FIG. 1, after the generalized harmonic map is obtained, the method 100 executes a step 104. In this step, the method 100 executes the process of: obtaining a volume foliation of the tetrahedral mesh T by preimages of all nodes of a metric graph $(G_r, h)$ and points on edges of the metric graph $(G_r, h)$ under the generalized harmonic map f. The step 104 will be further described below in combination with FIG. 5. FIG. 5 is a schematic diagram of a volume foliation showing an entity V with a genus of 3 according to an embodiment of the present invention.

As shown in FIG. 5, in one embodiment, a preimage of all nodes of the metric graph $(G, h)$ under the generalized harmonic map f is solved, and the preimage has three bifurcated curved surfaces; a preimage of points on edges of the metric graph (G, h) under the generalized harmonic map f is solved, and the preimage is like a topological disk; thus a volume foliation of the tetrahedral mesh T can be obtained.

The so-called foliation is to decompose a high-dimension manifold into a low-dimension manifold, and decompose a curved surface into a family of curves; each curve is called a leaf, and the leaves are stacked together to form the original curved surface. For example, a cover composed of a coordinate card U, of the following mapping is a p dimensional foliation of an n dimensional manifold. The details are as follows:

$$\varphi_i : U_i \to R^n,$$

so that a transformation function on an intersection $U_i \cap U_j$ has the following forms: $\varphi_{ij}(x,y)=(\varphi^1_{ij}(x), \varphi^2_{ij}(x,y))$, wherein x represents the first n-p coordinates, and y represents the next p coordinates. Stripes x=C (constant ripe) on the coordinate card $U_i$ are in coincidence with stripes on the other coordinate card $U_j$. Usually, these stripes are called spots of the foliation. In each coordinate card, spots are n-p dimensional sub manifolds. These sub manifolds go from one coordinate card to another coordinate card, thus forming the largest connected sub manifolds, which are called leaves of the foliation.

The foliation is essentially related to a vector field and a differential form. The foliation can be regarded as a low-dimension decomposition of the entity. The curved surface foliation decomposes a curved surface into a group of one-dimensional manifolds (loops), and the volume foliation decomposes the entity into a group of two-dimensional manifolds (topological disks). Both foliations can be induced by the generalized harmonic map, and the volume foliation is a structure which divides the entity into disjoint two-dimensional manifolds. The structure shown in FIG. 4 is a curved surface foliation, and the structure shown in FIG. 5 is a volume foliation. The volume foliation is consistent with the curved surface foliation on a boundary curved surface, with a critical trajectory in the middle. Except for the critical trajectory, all leaves of the volume foliation are topological disks.

Figure 6:
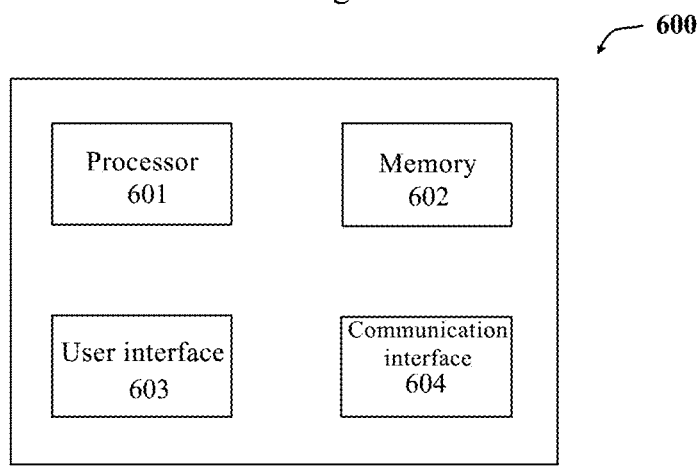
FIG. 6 is a composition block diagram schematically showing a device for generating a volume foliation according to an embodiment of the present invention.

From the above description in combination with FIG. 1 to FIG. 5, those skilled in the art can understand that the present invention proposes a method for generating a volume foliation based on the generalized harmonic map in one aspect, and also discloses a device for executing a generation operation by the method in another aspect. FIG. 6 is a composition block diagram schematically showing a device for generating a volume foliation according to an embodiment of the present invention.

As shown in FIG. 6, a device 600 of the present invention can comprise: a processor 601, which is configured to execute a program instruction; and a memory 602, which is configured to store the program instruction. When the program instruction is loaded and executed by the processor, the device is caused to execute the following steps: first, constructing a pants decomposition graph by a smooth closed surface S with a genus of g>1, wherein the surface S has g handles, and the pants are a genus-zero triangular mesh surface with g boundaries; then, constructing an initial mapping $$f_0 : (T, g) \to (G_r, h)$$

from a tetrahedral mesh T to a graph $G_r$ by a process of extending a topological disk $D_k$ into a cylinder $C_k$, wherein a cylinder $C_k \in T$ is mapped to an edge $e_k \in G$, and the upper and lower surfaces of a cylindrical surface are correspondingly mapped to nodes in a metric graph ($G_r$, h); next, evolving the initial mapping into a generalized harmonic map by n iterative mappings, wherein n=1, 2, . . . k+1; and finally, obtaining a volume foliation of the tetrahedral mesh T by preimages of all nodes of the metric graph ($G_r$, h) and points on edges of the metric graph ($G_r$, h) under the generalized harmonic map f.

In one embodiment, the processor 601 can be a general-purpose processor or a special-purpose processor, and can be configured to execute a computer program instruction, especially a computer program instruction stored in the memory 602, so that the device 600 can execute multiple embodiments of the method of the present invention shown in FIG. 1 to FIG. 5.

The device 600 can also comprise a user interface 603 and a communication interface 604. The user interface 603 can comprise one or more output devices, which may include, for example, one or more loudspeakers and/or one or more visual displays. The user interface 603 also comprises one or more input devices, including, for example, a keyboard, a mouse, a voice command, an input unit or a microphone, a touch screen display, a touch-sensitive tablet computer, a gesture capture camera, or other input buttons or controls. According to the present invention, the user interface 603 can receive data to be processed and display running results to a data analyst. The communication interface 604 may include a network interface, a modem, various communication ports, a bus, a communication link, a transceiver or other communication devices. According to the solution of the present invention, the communication interface can receive original or type-converted data for testing, and transmit various types of data and results to the user interface 603.

In another aspect, and in one embodiment, the present invention discloses a computer readable storage medium (CRSM) in which a program instruction is stored. The program instruction is suitable for being loaded by the processor and causing a computer to execute the following steps: first, constructing a pants decomposition graph by a smooth closed surface S with a genus of g>1, wherein the surface S has g handles, and the pants are a genus-zero triangular mesh surface with g boundaries; then, constructing an initial mapping $$f_0 : (T, g) \to (G_r, h)$$

from a tetrahedral mesh T to a graph $G_r$ by a process of extending a topological disk $D_k$ into a cylinder $C_k$, wherein a cylinder $C_k$ E T is mapped to an edge $e_k$ E G, and the upper and lower surfaces of a cylindrical surface are correspondingly mapped to nodes in a metric graph ($G_r$, h); next, evolving the initial mapping into a generalized harmonic map by the $n^{th}$ iterative mapping, wherein n=1, 2, . . . k+1; and finally, obtaining a volume foliation of the tetrahedral mesh T by preimages of all nodes of the metric graph ($G_r$, h) and points on edges of the metric graph ($G_r$, h) under the generalized harmonic map f.

Although no further description is given here, those skilled in the art may also contemplate that the computer readable storage medium (CRSM) further comprises a program instruction for executing the method described in combination with FIG. 1 to FIG. 5 based on the teaching of the present invention. When the program instruction is loaded by various computing devices including computers, the computing devices are caused to execute the operations described in combination with the drawings.

It should also be understood that any module, unit, component, server, computer, terminal or device that executes the instruction in the examples of the present invention may include or otherwise access a computer readable medium, such as a storage medium, a computer storage medium, or a data storage device (which may be removable and/or non-removable), for example, a magnetic disk, an optical disk or a magnetic tape. The computer storage medium may include a volatile/nonvolatile and removable/non-removable medium realized by any method or technology for storing information, such as a computer readable instruction, a data structure, a program module or other data.

Examples of the computer storage medium include an RAM, an ROM, an EEPROM, a flash memory or other storage technologies, a CD-ROM, a digital versatile disk (DVD) or other optical memories, a tape cartridge, a magnetic tape, a disk memory or other magnetic storage devices, or any other medium that can be used to store required information and can be accessed by an application, a module or both. Any such computer storage medium can be part of the device or be accessed or connected to the device. Any application or module described in the present invention can be realized by using a computer readable/executable instruction that can be stored or otherwise retained by such a computer readable medium.

Although the embodiments of the present invention are described as above, the contents are only embodiments adopted for the convenience of understanding the present invention, and is not intended to limit the scope and application scenarios of the present invention. Any of those skilled in the art of the present invention can make any modification and change on forms and details of the implementation on the premise of not deviating from the spirit and the scope disclosed by the present invention. However, the protection scope of the patent of the present invention must be still in accordance with the scope defined by the appended claims.

Finally, it should be noted that the above embodiments are only used for describing the technical solution of the present invention rather than limiting the present invention; and although the present invention is described in detail by referring to the above embodiments, those ordinary skilled in the art should understand that: the amendments to the technical solution recorded in each of the above embodiments or the equivalent replacements for part of or all the technical features therein do not enable the essence of the corresponding technical solution to depart from the scope of the technical solution of various embodiments of the present invention.

The invention claimed is:

1. A method for generating a volume foliation, wherein the method executes the following steps through one or more processors of a computer:
   constructing a pants decomposition graph on closed surface S of genus g>1, wherein the surface S has g handles, and the pants are a genus-zero triangular mesh surface with g boundaries;
   constructing an initial mapping $$f_0 : (T, g) \to (G_r, h)$$

from mesh T to a metric graph $G_r$ in a process of extending a topological disk $D_k$ into a solid cylinder $C_k$, wherein a cylinder $C_k \in T$ is mapped to an edge $e_k \in G$, and the upper and lower surfaces of a cylindrical surface are correspondingly mapped to nodes in the metric graph $(G_r, h)$;
   evolving the initial mapping into a generalized harmonic map by n iterative mappings, wherein n=1, 2, . . . k+1; and
   obtaining a volume foliation of the tetrahedral mesh T from preimages of all nodes of the metric graph $(G_r, h)$ and points on edges of the metric graph $(G_r, h)$ under the generalized harmonic map f.

2. The method according to claim 1, wherein the process of constructing a pants decomposition graph comprises:
   constructing a plurality pairs of pants $P_j$, and letting each pair of pants $P_j$ be corresponding to a node $\Gamma_j$ in the graph $G_r$ and each loop $\gamma_k$ be corresponding to an edge $e_k$ in the graph; assign the length of the edge with height parameter $h_k$, the loop $\gamma_k$ is connected with two pairs of pants $P_i$ and $P_j$, and nodes $\Gamma_i$ and $\Gamma_j$ are connected by the corresponding edge $e_k$ in the graph, wherein i,j=1, 2, . . . , 2g−2;
   and k=1, 2, . . . , 3g−3, thus to obtain the pants decomposition metric graph $(G_r, h)$ of the triangular mesh surface M.

3. The method according to claim 2, wherein the process of constructing a plurality pairs of pants $P_j$ comprises:
   approximately representing the surface S with the triangular mesh surface M, and designating a loop on each handle of the triangular mesh surface M, thus to obtain a group of loops $\gamma_1, \gamma_2, \gamma_g$;
   cutting the triangular mesh surface M along the loops $\gamma_1, \gamma_2, \gamma_g$ respectively, thus to obtain a genus-zero triangular mesh surface $M_i$ with 2g boundaries; and
   selecting a loop $\gamma_{g+i}$ on the surface $M_i$, so that after cutting the triangular mesh surface $M_i$ along this loop, a genus-zero triangular mesh surface $M_{i+1}$ with 2g−1 boundaries and a genus-zero triangular mesh surface with 3 boundaries (i.e., pants $P_j$) are obtained, wherein i,j=1, 2, . . . , 2g−2.

4. The method according to claim 1, wherein the process of extending a topological disk $D_k$ into a solid cylinder $C_k$ comprises:
   assuming that a directional triangular face set in the tetrahedral mesh T is $\{\Delta_1, \Delta_2, \ldots, \Delta_m\}$, and for the loop $\gamma_k$ (k=1, 2, . . . , 3g−3), solving a constraint optimization problem on $\lambda_l$(l=1, 2, . . . , m):

$$\min \sum_{l=1}^{m} \lambda_l^2$$

$$\text{s.t.} \begin{cases} \lambda_l \in \{-1, 0, +1\} \\ \sum_{l=1}^{m} \lambda_l \partial \Delta_l = \gamma_k \end{cases}$$

thus to obtain a set of solutions $\lambda_l^*$(l=1, 2, . . . , m); letting $D_k = \sum_{l=1}^{m} \lambda_l^* \Delta_l$, then $D_k$ is a topological disk with $\gamma_k$ as a boundary in the tetrahedral mesh T, i.e., $\delta D_k = \gamma_k$; and extending the topological disk $D_k$ into a solid cylinder $C_k$, so that $T=\cup_{k=1}^{3g-3} C_k$, then the solid cylinder $C_k$ is corresponding to the edge $e_k$ in the pants decomposition metric graph $(G_r, h)$.

5. The method according to claim 1, wherein the n iterative mappings comprise:

taking a vertex $v_i$ in the tetrahedral mesh T, recording an adjacent point set thereof as $\{\{v_j^i\}_{j=1}^{ni}$, assuming that an edge $[v_i, v_j^i]$ connecting vertices $v_i$ and $v_j^i$ is a common edge of m tetrahedrons $T_l(l=1, 2, \ldots, m)$ in the mesh T, and letting $$w_{ij} = \frac{1}{12}\sum_{l=1}^{m} a_l \cot\theta_l,$$

wherein $\theta_l$ is a dihedral angle corresponding to the edge $[v_i, v_j^i]$ in a tetrahedron $T_l$, $\alpha_l$ is the length of an edge opposite to the edge $[v_i, v_j^i]$ in the tetrahedron $T_l$, the $k^{th}$ iterative mapping is denoted as $$f_k : (T, g) \to (G_r, h),$$

and a weighted geodesic barycenter of $\{f_k(v_j^i)|v_j^i \in v_i\}$ is defined as follows:

$$c_k(v_i) \text{argmin}_{p \in G_T} \Sigma_{j=1}^{ni} w_{ij} d(p, f_k(v_j^i))^2,$$

wherein $d(p, f_k(v_j^i))$ represents the length of the shortest path between two points P and $f_k(v_j^i)$ in the graph $G_r$; and using the weighted geodesic barycenter $C_k(v_i)$ to update the image of $v_i$ in the mapping $f_k$, thereby obtaining the $(k+1)^{th}$ iterative mapping:

$$f_{k+1}(v_i) \leftarrow c_k(v_i).$$

6. The method according to claim 5, wherein the process of evolving the initial mapping into a generalized harmonic map comprises:

denoting the set of all edges in the tetrahedral mesh T as $\Delta = \{[v_i, v_j]\}$, and defining the harmonic energy of the mapping $$f_k : (T, g) \to (G_r, h)$$

as:

$$E(f_k) := \frac{1}{2}\sum_{[v_i,v_j]\in\Lambda} w_{ij} d(f_k(v_i), f_k(v_j))^2;$$

when the harmonic energy difference $E(f_k)-E(f_{k+1})$ of two adjacent iterative mappings is less than a given threshold, iteration is terminated and a generalized harmonic map $f+f_{k+1}$ is obtained.

7. A device for generating a volume foliation, wherein the device comprises:

a processor, which is configured to execute a program instruction; and a memory, which is configured to store the program instruction; and when the program instruction is loaded and executed by the processor, the device is caused to execute the method according to claim 1.

8. A computer readable storage device, wherein a program instruction for generating a volume foliation is stored in a storage medium; and when the program instructions executed by the processor, a computer is caused to execute the method according to claim 1.

* * * * *